(12) United States Patent
Tien

(10) Patent No.: US 8,536,858 B2
(45) Date of Patent: Sep. 17, 2013

(54) OSCILLOSCOPE PROBE ASSEMBLY

(75) Inventor: Chun-Yuan Tien, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 408 days.

(21) Appl. No.: 12/869,873

(22) Filed: Aug. 27, 2010

(65) Prior Publication Data
US 2011/0304320 A1    Dec. 15, 2011

(30) Foreign Application Priority Data
Jun. 11, 2010   (TW) .............................. 99118985 A

(51) Int. Cl.
*G01R 13/20*   (2006.01)
*G01R 1/06*    (2006.01)

(52) U.S. Cl.
USPC ................. 324/121 R; 324/149; 324/754.02; 324/755.01

(58) Field of Classification Search
None
See application file for complete search history.

(56) References Cited

U.S. PATENT DOCUMENTS

| | | | | | |
|---|---|---|---|---|---|
| 3,256,484 | A | * | 6/1966 | Terry | ........................... 324/72.5 |
| 4,114,095 | A | * | 9/1978 | Pankove et al. | ........... 324/121 R |
| 4,473,857 | A | * | 9/1984 | Winter | ........................ 361/91.2 |
| 4,923,407 | A | * | 5/1990 | Rice et al. | ........................ 439/92 |
| 5,235,268 | A | * | 8/1993 | Harthcock | .................... 324/115 |
| 6,831,452 | B2 | * | 12/2004 | McTigue | .................... 324/72.5 |
| 7,888,956 | B2 | * | 2/2011 | Lee et al. | ................. 324/754.07 |

* cited by examiner

*Primary Examiner* — Vinh Nguyen
(74) *Attorney, Agent, or Firm* — Altis Law Group, Inc.

(57) ABSTRACT

An oscilloscope includes a number of probe assemblies. Each probe assembly includes a probe and a connecting member. The connecting member includes a first connecting portion that may be coiled around the probe and a second connecting portion. The probes are connected together by the connecting members, and can be grounded by soldering one of the second connecting portions to a ground plane.

9 Claims, 4 Drawing Sheets

OSCILLOSCOPE PROBE ASSEMBLY

BACKGROUND

1. Technical Field

The disclosure generally relates to probe assemblies, particularly to a probe assembly used with an oscilloscope.

2. Description of Related Art

Oscilloscopes are widely used to analyze input/output electronic signal waveforms. Commonly, probes used to get the waveforms are configured with clamps so they can be attached to electronic parts. However, the clamps are easily accidentally disconnected from the parts. Therefore, users may have to temporarily solder probes to test points on, for example, circuit boards. However, when a large amount of the probes are used, it will be inconvenient for users to solder the probes one by one.

Therefore, there is room for improvement within the art.

BRIEF DESCRIPTION OF THE DRAWINGS

Many aspects of the probe assembly for oscilloscope can be better understood with reference to the following drawings. The components in the drawings are not necessarily drawn to scale, the emphasis instead being placed upon clearly illustrating the principles of the probe assembly for oscilloscope.

DETAILED DESCRIPTION

Figure 1:
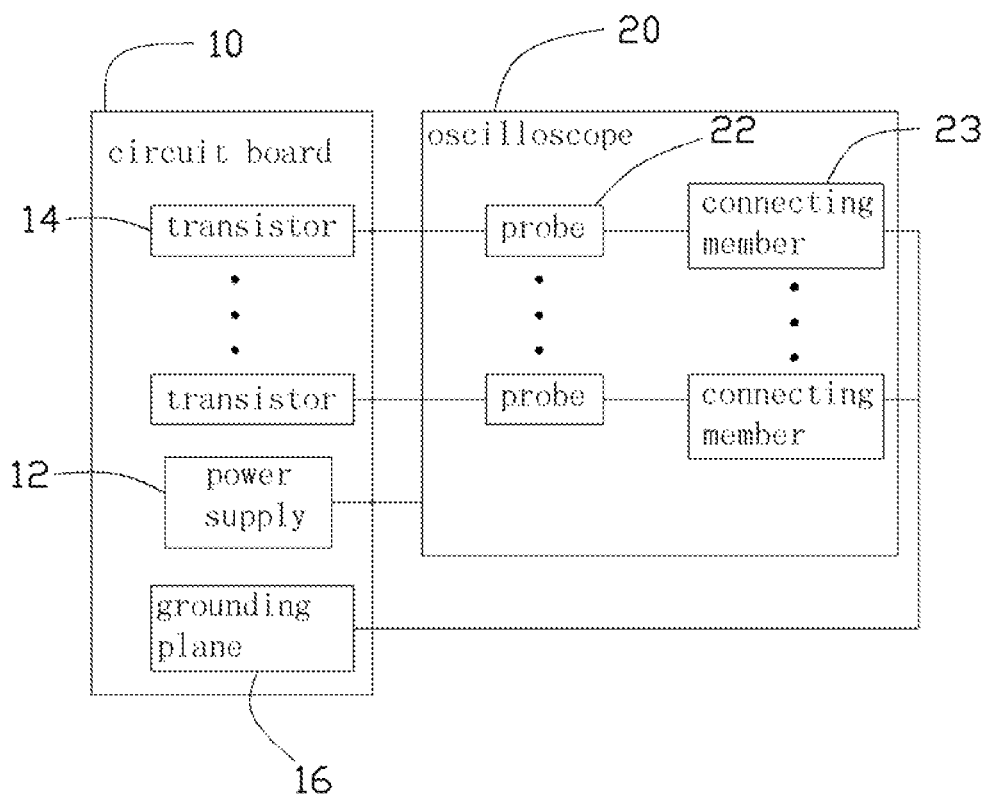
FIG. 1 is block diagram of an oscilloscope employed with a probe assembly configured for testing circuit boards, according to an exemplary embodiment.

FIG. 1 shows an oscilloscope 20 used to check input/output signals of electronic members such as transistors 14 mounted on a circuit board 10, according to an exemplary embodiment. The circuit board 10 further includes a power supply 12, and a grounding plane 16 for respectively providing electrical power and ground for the oscilloscope 20.

Figure 2:
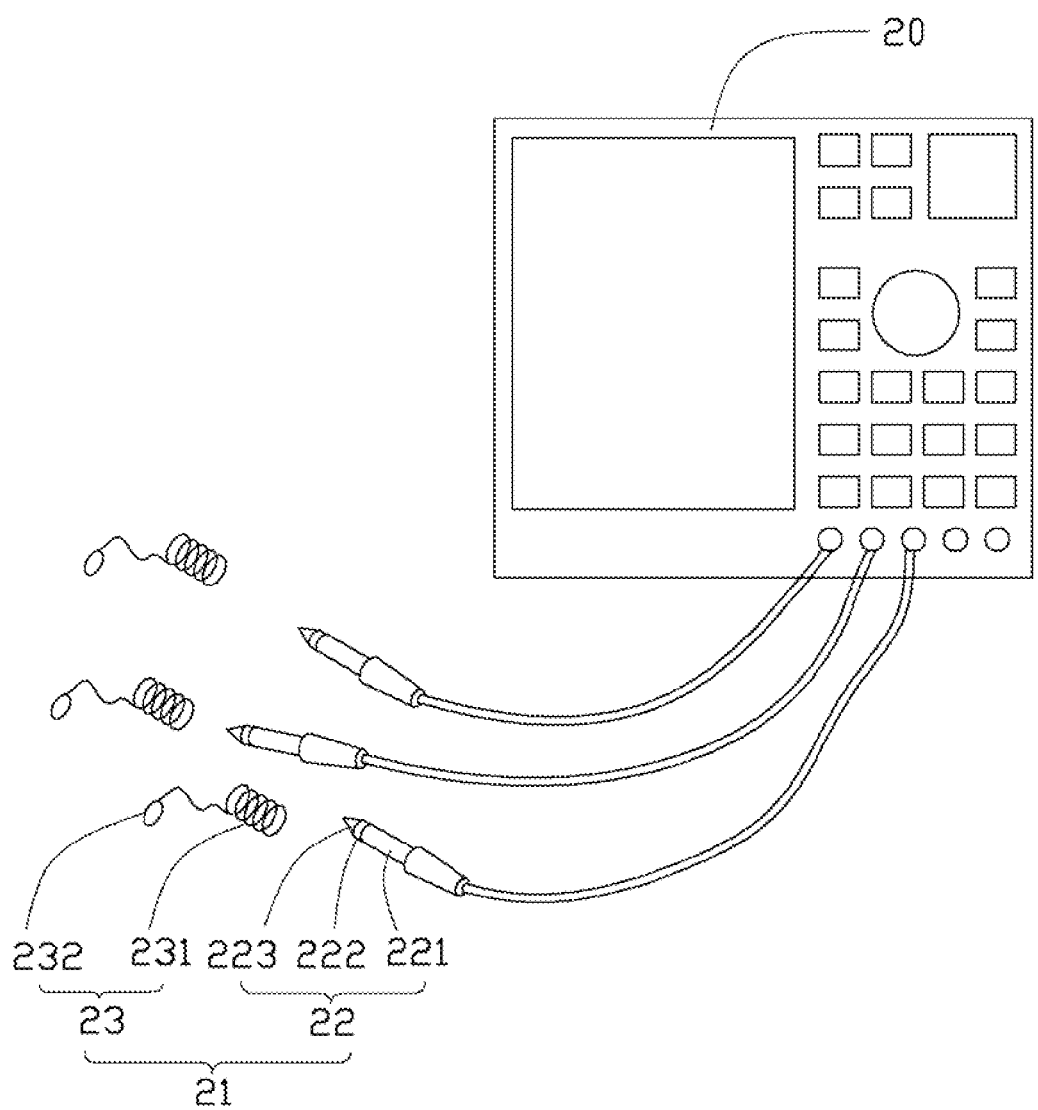
FIG. 2 is a schematic view of the oscilloscope of FIG. 1.

Referring to FIG. 2, the oscilloscope 20 includes a plurality of probe assemblies 21. In this exemplary embodiment, there are three probe assemblies 21. Each probe assembly 21 includes a probe 22 and a connecting member 23. Each probe 22 includes a grounding portion 221, an isolating portion 222, and a tip 223. The grounding portion 221 is for connecting to the ground plane 16. The isolating portion 222 is arranged between the grounding portion 221 and the tip 223 to isolate the grounding portion 221 from the tip 223. The tip 223 is for contacting one of the transistors 14.

Figure 3:
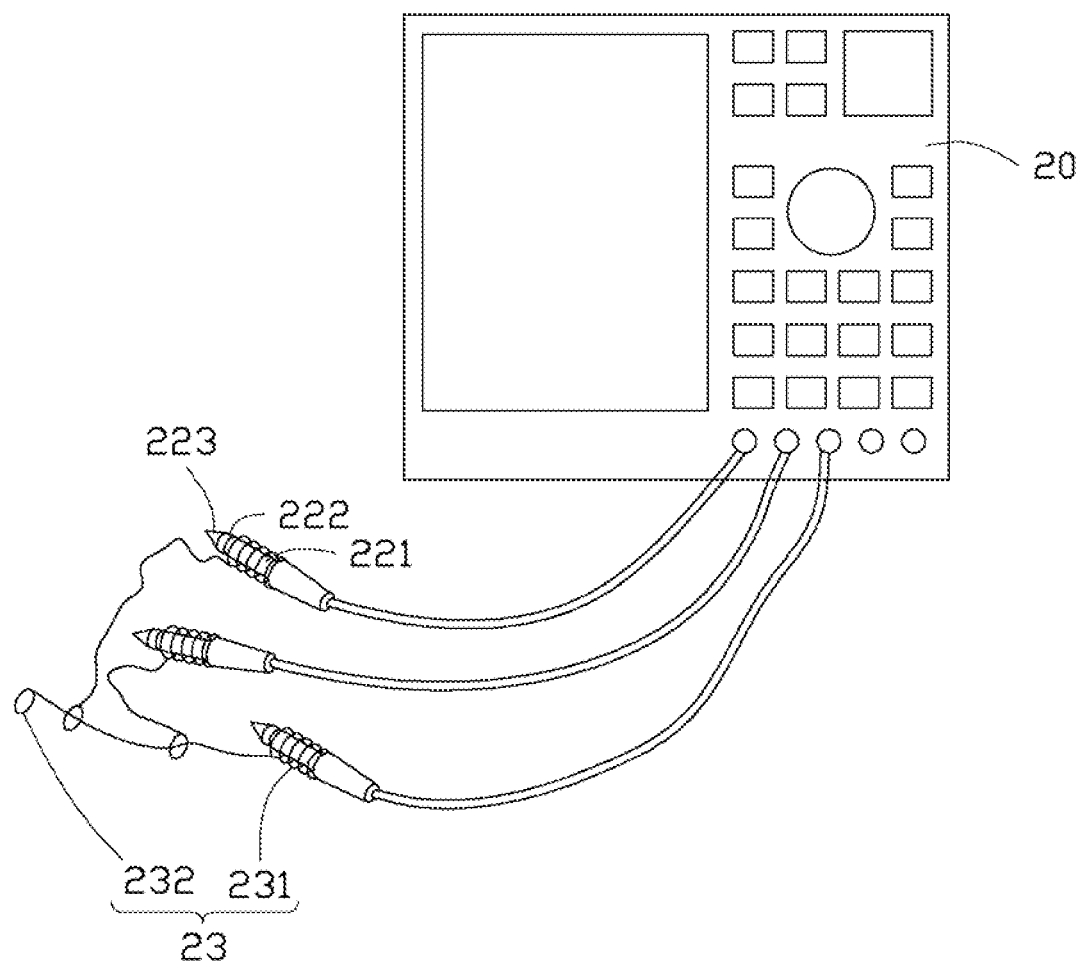
FIG. 3 is a schematic view of the oscilloscope of FIG. 1 when the probes are connected together, according to an exemplary embodiment.

Referring to FIG. 3, each connecting member 23 is a metal wire including a first connecting portion 231 at one end and a second connecting portion 232 forming the other end. The first connecting portion 231 is connected to the grounding portion 221 of the probe 22, such as by being coiled around the grounding portion 221. The second connecting portion 232 is for connecting to another connecting member 23 or for soldering to the ground plane 16 and may be in the form of a coil. One of the second connecting portions 232 passes through the other connecting portions 232 connecting all the connecting members 23 together, and all connecting members can be grounded by soldering only this one second connecting portion 232 to the ground plane 16.

Figure 4:
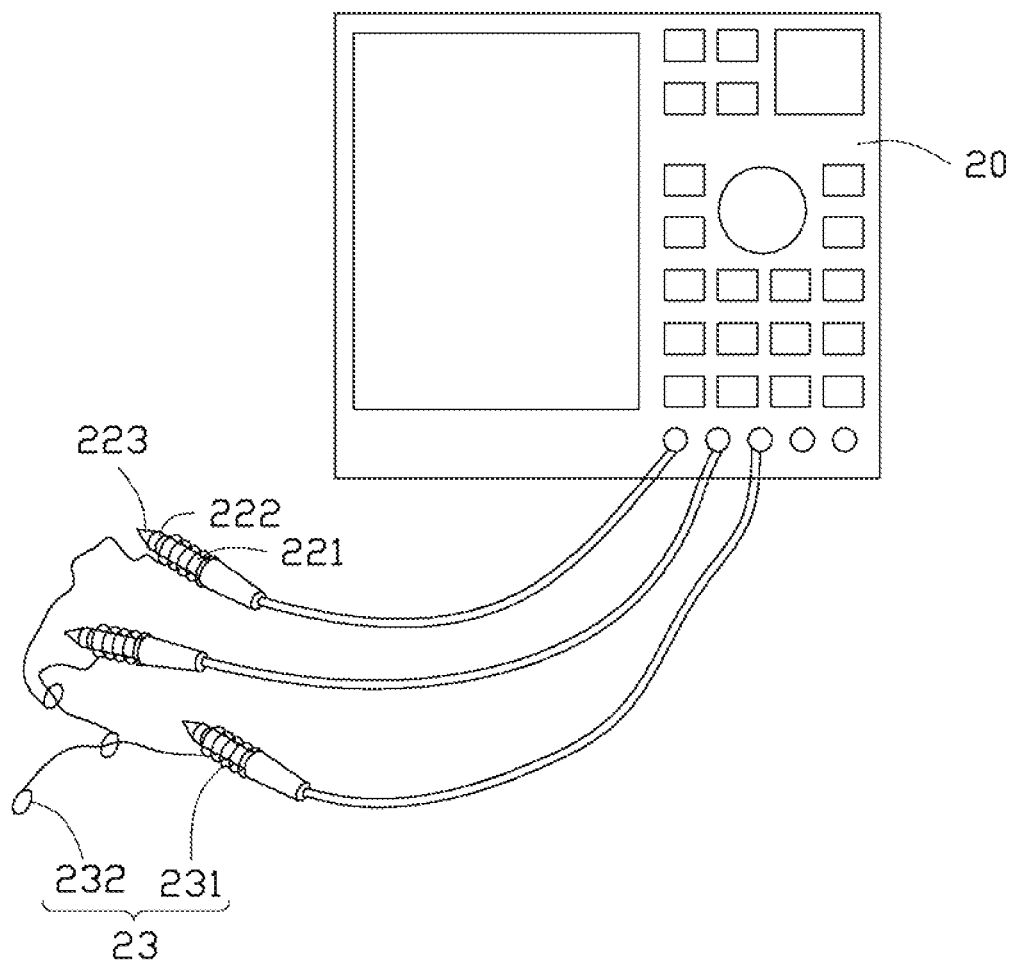
FIG. 4 is schematic view of the oscilloscope of FIG. 1 when the probes are connected together, according to another exemplary embodiment.

Referring to FIG. 4, in other exemplary embodiments, one of the second connecting portions 232 is designated as a beginning one. A next second connecting portion 232 passes through the beginning second connecting portion 232. A last second connecting portion 232 passes through the next second connecting portion 232. Therefore, all of the probes 22 are connected together by the connecting members 23, and can all be grounded just by soldering only the last second connecting portion 232 to the ground plane 16.

In use, the power supply 12 provides electrical power to the oscilloscope 20. Each first connecting portion 231 is coiled around one of the first grounding portion 221 of the probes 22. The second connecting portions 232 are connected together. One of the second connecting portions 232 is soldered to the ground plane 16 to ground all probes 22. The tip portions 223 contact respectively contact the transistors 14. The oscilloscope 20 displays input/output signal waveforms of the transistors 14.

The probes 22 of the oscilloscope 20 can be grounded by soldering only one connecting member 23 to the ground plane 16, which is convenient for users.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An oscilloscope comprising:
    a plurality of probe assemblies; each probe assembly comprising:
    a probe; and
    a connecting member including a first connecting portion connected to the probe and a second connecting portion, wherein the probes connect together by the connecting member, and can be grounded by soldering one of the second connecting portions to a ground plane; one of the second connecting portions passes through the other second connecting portions connecting all the connecting members together, the probes can be grounded by soldering one of the second connecting portions to a ground plane; the first connecting portion is a coil connected to the probe; the probe includes a grounding portion, an isolating portion and a tip portion, the isolating portion is arranged between the grounding portion and the tip portion, the first connecting portion is coiled around the grounding portion of the probe.

2. The oscilloscope as claimed in claim 1, wherein the connecting member is a metal wire.

3. The oscilloscope as claimed in claim 2, wherein the first connecting portion is at one end of the connecting member.

4. The oscilloscope as claimed in claim 3, wherein the second connecting portion is a ring arranged at the other end of the connecting member.

5. A probe assembly; comprising:
    a probe; and
    a connecting member including a first connecting portion connected to the probe and a second connecting portion for connecting to other connecting members or for soldering to a ground plane wherein the probe includes a grounding portion, an isolating portion and a tip portion, the isolating portion is arranged between the grounding portion and the tip portion, the first connecting portion is coiled around the grounding portion of the probe.

6. The probe assembly as claimed in claim 5, wherein the first connecting portion is a coil connected to the probe.

7. The probe assembly as claimed in claim 5, wherein the connecting member is a metal wire.

8. The probe assembly as claimed in claim 7, wherein the first connecting portion is at one end of the connecting member.

9. The probe assembly as claimed in claim 8, wherein the second connecting portion is a ring arranged at the other end of the connecting member.

* * * * *